(12) United States Patent
Phan Le et al.

(10) Patent No.: US 9,209,746 B2
(45) Date of Patent: Dec. 8, 2015

(54) MEMS OSCILLATORS

(71) Applicant: NXP B.V., Eindhoven (NL)

(72) Inventors: Kim Phan Le, Eindhoven (NL); Jozef Thomas Martinus van Beek, Rosmalen (NL); Martijn Goossens, Veldhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/090,397

(22) Filed: Nov. 26, 2013

(65) Prior Publication Data
US 2014/0159826 A1    Jun. 12, 2014

(30) Foreign Application Priority Data
Nov. 28, 2012  (EP) .................................... 12194616

(51) Int. Cl.
*H03B 5/30* (2006.01)
*H03B 5/42* (2006.01)

(52) U.S. Cl.
CPC .. *H03B 5/30* (2013.01); *H03B 5/42* (2013.01); *H03B 2200/0016* (2013.01)

(58) Field of Classification Search
CPC ......................................................... H03B 5/30
USPC .............................................. 331/154, 116 M
See application file for complete search history.

(56) References Cited

U.S. PATENT DOCUMENTS

| 2,981,899 | A | 4/1961 | Hahnel |
| 7,042,213 | B2 * | 5/2006 | Greywall ..................... 324/244 |
| 7,382,205 | B2 | 6/2008 | Van Beek |
| 2011/0050214 | A1 | 3/2011 | Bahreyni et al. |
| 2011/0204999 | A1 | 8/2011 | Phan Le et al. |
| 2011/0260802 | A1 * | 10/2011 | Villanueva Torrijo et al. ............................ 331/156 |

FOREIGN PATENT DOCUMENTS

| EP | 2 416 495 A1 | 2/2012 |
| WO | 2010/041209 A1 | 4/2010 |

OTHER PUBLICATIONS

Rahafrooz et al., "High-Frequency Thermally Actuated Electromechanical Resonators With Piezoresistive Readout", IEEE Transactions on Electron Devices, vol. 58, No. 4, April 2011, pp. 1205-1214.*
Bontemps, J. J. M. et al. "56 MHZ Piezoresistive Micromechanical Oscillator", Solid-State Sensors, Actuators and Microsystems, p. 1433-1436 (Jun. 21, 2009).
Hajjam, A. et al. "Input-Output Insulation in Thermal-Piezoresisitive Resonant Microstructures Using Embedded Oxide Beams", IEEE Frequency Control Symposim, p. 1-4 (May 2012).
Bahreyni, B. et al. "Oscillator and Frequency-Shift Measurement Circuit Topologies for Micromachined Resonant Devices", Sensors and Actuators, A Physical, vol. 137, No. 1, p. 74-80 (May 2007).

(Continued)

*Primary Examiner* — Ryan Johnson

(57) ABSTRACT

The invention provides MEMS oscillator designs in which the thermal actuation and piezoresistive detection signals are separated.

A first approach splits the frequency of the loop into two distinct components, an actuation frequency and a detection frequency. A second approach modifies the design of the MEMS resonator such that the actuation signal follows a different path through the MEMS resonator than the detection signal.

10 Claims, 18 Drawing Sheets

(56) References Cited

OTHER PUBLICATIONS

Rahafrooz, A. et al. "High Frequency Dual-Mode Thermal-Piezoresistive Oscillators" IEEE Joint Conference of Frequency Control and the European Frequency and Time Forum, p. 1-4 (May 2, 2011).

Chen, C-C. et al. "Thermally-Actuated and Piezoresistively-Sensed CMOS-MEMS Resonator Array Using Differential-Mode Operation", IEEE International Frequency Control Symposium, p. 1-4 (May 2012).

Extended European Search Report for Patent Appln. No. 12194616.4 (Jul. 18, 2013).

Beardslee, L. A. et al. "Thermal Excitation and Piezoresistive Detection of Cantilever In-Plane Resonance Modes for Sensing Applications", Journal of Microelectromechanical Systems, vol. 19, No. 4, p. 1015-1017 (Aug. 4, 2010).

Reichenbach, R. B. et al. "RF MEMS Oscillator with Integrated Resistive Transduction", IEEE Electron Device Letters, vol. 27, No. 10, pp. 805-807 (Oct. 2006).

* cited by examiner

MEMS OSCILLATORS

CROSS-REFERENCE TO RELATED APPLICATIONS

This application claims the priority under 35 U.S.C. §119 of European patent application no. 12194616.4, filed on Nov. 28, 2012, the contents of which are incorporated by reference herein.

This invention relates to MEMS oscillators, for example for generating clock signals or reference frequency signals, and relates in particular to oscillators using MEMS resonators.

MEMS oscillators are considered a disruptive technology that can replace quartz crystal oscillators in electronics. This type of device offers small size, low cost and potentially high level of integration with CMOS ICs. Oscillators are widely used in time-keeping and frequency reference applications such as real-time-clocks, RF modules in mobile phones, devices containing blue-tooth modules, and other digital and telecommunication devices.

The conventional MEMS-based oscillator is schematically shown in FIG. 1. Basically it consists of a MEMS resonator 10 and an external amplifier circuit 12. The MEMS resonator consists of a silicon mass-spring system, which can be excited into mechanical resonant vibration, and means to sense this vibration and to convert it into electrical signal. The electrical signal is fed into an amplifier circuit. This circuit basically consists of a gain amplifier and a phase shifter. The output of the amplifier is fed back into the actuation terminal of the resonator. If the total loop gain is equal or larger than unity and the loop phase shift is zero, the oscillation can be maintained within the loop.

There are several ways to sense the signal and to excite the resonator. The most common way to excite the resonator is to use the electrostatic actuation principle. In this method, a combination of an AC (with a frequency ω) and a DC voltage is applied to one or several electrodes, which are separated from the mass of the resonator by small gaps. The actuation voltage exerts an electrostatic force of frequency ω on the resonator mass and drives the resonator into resonance when ω is matched to the mechanical resonant frequency of the resonator. Besides the electrostatic method, other methods such as piezoelectric actuation, thermal actuation have been known as means to excite MEMS resonators.

In most MEMS resonators, sensing is performed using capacitive or piezoresistive methods.

A known combination of actuation and read out principles uses electrostatic actuation and piezoresistive sensing. An example of such as device is described in U.S. Pat. No. 7,382,205 and US 2011204999.

FIG. 2 shows an example of a similar device. In this example, the silicon MEMS resonator has a form of a flat figure (with a thickness of a few to a few tens of micrometers) and is shaped in the lateral dimensions to a dog-bone. A real image of such a device in shown in FIG. 3.

The dog-bone resonator consists of two heads 20, connected together by four beams (two parallel beam structures 22 each comprising two beams in series). The four beams are fixed to a silicon substrate by two anchors 24 in the middle of the structure. The rest of the dog-bone structure is free-standing. The heads 20 of the dog-bone face two electrodes 28, over small gaps.

The resonator is actuated by a combination of a DC bias voltage and a AC voltage $v_{act}(\omega)$ over the electrodes. The resulting electrostatic force which has a component of ω drives the dog-bone resonator into resonance, when ω is equal to its mechanical resonant frequency. In the resonance mode, the two heads of the device swing left and right (in this figure) symmetrically (as indicated by the double-head arrows). The beams of the resonator are strained due to the vibration. To sense the vibration, a DC current is sent though the beams via the anchors.

Thanks to the piezoresistance effect, the resistance of the beams is modulated by the strain, which finally results in an AC signal voltage $v_{sens}(\omega)$ at the output of the current source. An amplifier 29 is placed in between the output and the input of the resonator to close the oscillator loop. If the total loop gain is 1 or larger and the loop phase is close to zero, an oscillation is maintained within the loop. The oscillation signal can be coupled out for use in applications by connecting to a point on the loop, such as at the output of the amplifier.

In order to increase the electro-mechanical coupling of the electrostatic actuation, it is desired that (1) the gaps be as small as possible and (2) the electrode areas be as large as possible. The first requirement makes the process complicated and difficult in some cases when gaps of smaller than about 200 nm are required. The second requirement puts constrains on the design of the resonator. For instance, when scaling up the frequency, the size should be reduced, thus the electrode area cannot be made large enough for efficient actuation.

It is known that to reduce the temperature dependence of frequency, the silicon resonator can be partially oxidized at the outer skin (since silicon dioxide has a temperature coefficient of frequency of opposite sign to that of silicon). A side-effect of the oxidized skin is that due to charges trapped in the oxide layer, the electrical field inside the actuation gap is modified, and drifts, and thus changes the frequency due to the spring softening effect (the effect in which the effective spring stiffness of the resonator, thus also the frequency, changes with the DC bias voltage). Besides, since the actuation force depends on the DC bias voltage, if this bias voltage is changed, and especially if it is reduced due to the developed charge, the force is changed or in the worst case reduced gradually, leading eventually to a stop of oscillation.

Due to the above problems, the applicant has previously proposed that another actuation method rather than the electrostatic actuation should be used. MEMS piezoresistive resonators can be actuated thermally and readout using the piezoresistance effect. If an AC current is sent through the beams of the resonator, due to the periodic Joule heating and cooling via conduction, an alternating strain is induced in the beams, which can drive the resonator into the resonance.

However, a problem of this method arises because the thermal actuation and piezoresistive sensing are performed on the same set of beams. At the anchor point not connected to ground, the device receives an actuation current, but at the same time, it also outputs a piezoresistive signal which is proportional to the vibration of the resonator, at the same frequency as the actuation current. The input signal directly feeds through the device to the output, and adds to the output piezoresistive signal. If the device is connected to an amplifier to form an oscillation loop, the amplifier sees two signals of the same frequency: the vibration-related signal (the piezoresistive signal) and the feedthrough signal at the same time. The second is larger in amplitude than the first, while only the first is useful to maintain the oscillation. Consequently, the amplifier might be saturated by the feed-through signal and the oscillation might not be correctly maintained.

There is therefore a need to separate the actuation and detection signal.

The invention is defined by the claims.

According to a first aspect of the invention, there is provided an oscillator comprising:

a MEMS resonator body;

an AC current source for providing an AC current to a resonator input coupled to the resonator body, thereby to induce an alternating strain in the resonator by means of the thermal expansion effect to drive the resonator into resonance; and a piezoresistive read out sensor for monitoring a resistance of at least a portion of the resonator to derive an oscillating output signal at an output of the oscillator; and an oscillator circuit, wherein the oscillator circuit provides the ac current with a first frequency $\omega_1$ to actuate the resonator body and wherein a second different frequency $\omega_2$ is generated in the resonator by the piezoresistive effect to derive the output signal, wherein the oscillator circuit comprises a converter in a feedback control loop between the oscillator output and the resonator input for converting from the second frequency to the first frequency.

According to a second aspect, there is provided an oscillator comprising:

a MEMS resonator body;

an AC current source for providing an AC current to a resonator input coupled to the resonator body, thereby to induce an alternating strain in the resonator by means of the thermal expansion effect to drive the resonator into resonance; and a piezoresistive read out sensor for monitoring a resistance of at least a portion of the resonator based on a signal at a resonator output to derive an oscillating output signal at an output of the oscillator; and an oscillator circuit, wherein the AC current is provided to a first portion of the resonator and the piezoresistive read out is provided based on the resistance of a second portion of the resonator.

The invention provides two solutions to the problems outlined above. A first approach is to separate the actuation (input) and sensing (output) in the frequency domain. The second approach is to separate the actuation (input) and sensing (output) electrically.

The first approach is to use two frequencies in the oscillation loop. The actuation frequency is converted at the resonator to the resonant frequency using the Joule's heating effect. The readout signal (at the same resonant frequency or at another frequency) is subsequently converted back to the actuation frequency, optionally phase-shifted and fed back to the resonator to close the oscillation loop. By using two distinct frequencies in the loop, the unwanted feedthrough signal is filtered out and will no longer affect the intended signal.

The second approach is to provide in the resonator (which can be a dogbone-shape or a ring shape), two separate electrical paths for the actuation (input) and for the detection (output). The capacitive coupling between those two paths can be made as small as possible to minimize the feedthrough.

The current supplied can be AC or a combination of AC and DC.

In one example, the resonator comprises two masses connected by a pair of parallel beams, with the AC current provided to one beam and being drained from the other beam. This defines the dogbone configuration.

In a first implementation of the second aspect, the oscillator comprises a resonator ring, having a plurality of piezoresistive portions spaced around the ring, wherein a first piezoresistive portion is between the resonator input and a power supply terminal, and a second piezoresistive portion is between the resonator output and a power supply terminal. There can be two or more connected resonator rings, each having a plurality of piezoresistive portions spaced around the ring.

In one configuration of two rings, one ring has differential inputs, with a respective piezoresistive portion between each differential input and a first power supply terminal and a respective piezoresistive portion between each differential input and a second power supply terminal, and the other ring has differential outputs, with a respective piezoresistive portion between each differential output and the first power supply terminal and a respective piezoresistive portion between each differential output and the second power supply terminal.

In an alternative configuration of two rings, one ring has one of a pair of differential inputs and one of a pair of differential outputs, with a respective piezoresistive portion between each and a first power supply terminal and a respective piezoresistive portion between each and a second power supply terminal, and the other ring has the other of the pair of differential inputs and the other of the pair of differential outputs, with a respective piezoresistive portion between each and a first power supply terminal and a respective piezoresistive portion between each and a second power supply terminal.

These resonator rings can have a single piezoelectric region at the respective position, for example at an outer periphery of the ring.

In another design, the resonator ring has a plurality of piezoresistive portions spaced around the ring, wherein each piezoresistive portion comprises a radially inner section and a radially outer section, and the outer sections are connected to input and/or output terminals and the inner sections are connected to power supplies. The input/output terminals can instead be connected to the inner sections and the power supplies connected to the outer terminals.

In one version, there are four piezoresistive portions, and wherein two adjacent inner sections are connected together to a first power supply, and the other two inner sections are connected together to a second power supply. Two adjacent outer sections can be connected to the input terminal, and the other two outer sections can connected to the output terminal, with the pairs of connected inner sections staggered with respect to the pairs of connected outer sections.

There can again be two (or more) connected rings, each having a plurality of piezoresistive portions spaced around the rings. In one version, one ring has differential inputs and the other ring has differential outputs. In another version one ring has one of a pair of differential inputs and one of a pair of differential outputs, and the other ring has the other of the pair of differential inputs and the other of the pair of differential outputs.

The second aspect can also make use of a dog-bone resonator design. In this case, the resonator comprises two masses connected by a pair of parallel beams, with the AC current provided to the centre of one beam and being drained from the centre of the other beam, and passing through one of the masses, and the piezoresistive readout is based on a current flowing from the centre of one beam to the centre of the other beam through the other mass. One mass is doped with one polarity type and the other mass is doped with an opposite polarity type, to enable separation of the signal flows through the two masses.

Multiple resonators of this design can also be coupled together.

Examples of the invention will now be described in detail with reference to the accompanying drawings, in which.

The invention provides approaches for separating the actuation and detection signal in a thermally actuated oscillator.

The essence of a first approach is to split the frequency of the loop into two distinct components: frequency $\omega_1$ is used to thermally actuate the device and another frequency $\omega_2$ is generated in the resonator by the piezoresistive effect. The output signal of frequency $\omega_2$ is amplified. Before going back to the resonator, the frequency of the amplified signal is preferably modified to become $\omega_1$. A feedthrough signal may exist and it will then also be amplified. When its frequency is then also modified in the same way, it becomes a different frequency component that is not favourable for the resonance and is filtered out by the resonator. In this way, there is no feedthrough signal that can make the full loop through resonator and amplifier. Therefore, the oscillation condition can be fulfilled more easily The essence of a second approach is to modify the design of the MEMS resonator such that the actuation signal follows a different path through the MEMS resonator than the detection signal. Several different designs are possible.

Figure 4:
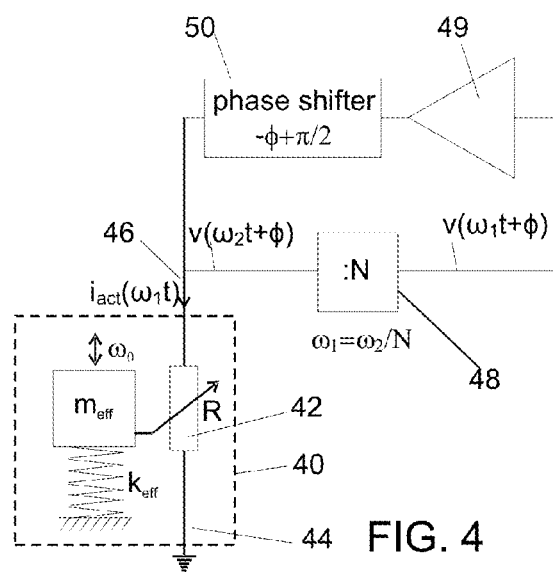
FIG. 4 shows conceptually a first approach of the invention.

The general principle of thermal oscillator according to the first approach above is shown in FIG. 4. The oscillator consists of a MEMS resonator 40 and an external oscillator circuit. The resonator comprises of a mass-spring system with at least one anchor, and a piezoresistive element 42. The mass-spring system has an effective mass $m_{eff}$ and an effective spring stiffness $k_{eff}$. The mass-spring system has a natural frequency determined by $\omega_0 = \sqrt{(k_{eff}/m_{eff})}$. The piezoresistive element can be a separated element or partly overlaps the spring and/or the mass of the resonator. Preferably the piezoresistive element overlaps the spring as much as possible because the sensing is then most effective.

The piezoresistive element should be mechanically coupled to the resonator, such that stress of the element can actuate the resonator, and the vibration of the resonator can cause piezoresistance change in the element. The material of the piezoresistive element should show, of course, sizable piezoresistance effect. Examples of such material are semiconductors such as silicon, germanium or silicon-germanium compound, etc.

The piezoresistive element has at least two terminals: a ground terminal 44 and a signal terminal 46. During stable oscillation, from the signal terminal to the ground terminal, flows an actuation current. This current may have several AC/DC components, but must have at least one AC component $i_{act}(\omega_1 t)$ of frequency $\omega_1$. The frequency $\omega_1$ should be chosen such that when the actuation current is converted into Joule's heating power inside the piezoresistive element, a component of the AC heating power should have a frequency of $\omega_0$, where $\omega_0$ is the resonance frequency of the resonator.

Thanks to the periodic heating of this AC component, and the thermal expansion effect, the piezoresistive element periodically expands and contracts with the same frequency $\omega_0$. Besides, this vibration is slightly phase-shifted to an amount $\phi$ with respect to the actuation current due to thermal inertia. Since the piezoresistive element is mechanically coupled to the mass-spring system, the mass-spring system is driven into resonance of frequency $\omega_0$.

As a result, the piezoresistive element is further strained by the resonant vibration at $\omega_0$ and thus the resistance of the piezoresistive element is modulated with the same frequency $\omega_0$ and with a phase-shift $\phi$. When mixing with the actuation current, this resistance modulation finally leads to an output signal voltage $v_s$ at the signal terminal. This voltage has a component (among others) of frequency $\omega_2$, and with a phase shift of $\phi$.

Next, the frequency of the signal voltage is divided in a divider circuit 48 (denoted as: N in the schematic). The division number N should be selected such that $\omega_1 = \omega_2/N$, in which $\omega_1$ and $\omega_2$ are frequencies of the output and input of the divider, respectively.

The voltage signal of frequency $\omega_1$, after the divider is subsequently fed into a transconductance amplifier 49. A transconductance amplifier is a circuit that can convert a voltage at its input to a current at the output with some amplification gain. The amplifier is preferably tuned to selectively amplify only component $\omega_1$.

After the amplifier, the signal is shifted in phase in a phase shifter 50. The amount of phase shift is preferably close to $-\phi \pm \pi/2$. The first term of the phase shift is to compensate for the thermal inertia phase shift which occurs during actuation. The second term is used to meet the most efficient actuation condition. As will be explained below, the force should lead the displacement by a phase angle of $\pi/2$. The second term is used to satisfy this condition.

The sign in front of the $\pi/2$ term depends on the sign of the piezoresistive gauge factor of the silicon material. The phase shift is $-\phi - \pi/2$ when the gauge factor is positive, and $-\phi + \pi/2$ when the gauge factor is negative. For silicon, the sign of the piezoresistive gauge factor depends on the doping type. P-type silicon has positive gauge factor and n-type silicon possesses negative gauge factor.

At the output of the phase shifter, an AC current having a component of $\omega_1$, with a phase difference of close to $-\pi/2$ with respect to the mechanical vibration of the piezoresistive element, is generated. This current is sent back into the signal terminal of the piezoresistive element for actuation. When the amplification gain of the amplifier is large enough (the total loop gain equals 1 or larger), an oscillation is maintained with the loop. The oscillation signal can be tapped out at a certain point within the loop, preferably after the amplifier, to be used in an application.

The feedthrough component $\omega_1$ and other components with frequencies different than $\omega_2$ created at the signal terminal are also divided, amplified and converted to thermal expansion in the same way as $\omega_2$. However, after this series of processes, they become components with frequencies different than $\omega_0$, which are not favourable for the resonance and are filtered out from the oscillation loop.

Besides, since the components different than $\omega_2$ are not favourably amplified by the amplifier and are divided in an unfavourable way, they cannot self oscillate within the loop.

Note that the connection sequence of the divider, amplifier and phase shifter within the loop shown in FIG. 4 can be different, such as amplifier-divider-shifter, or amplifier-shifter-divider, etc. The phase shifter can also be part of the amplifier.

Figure 3:
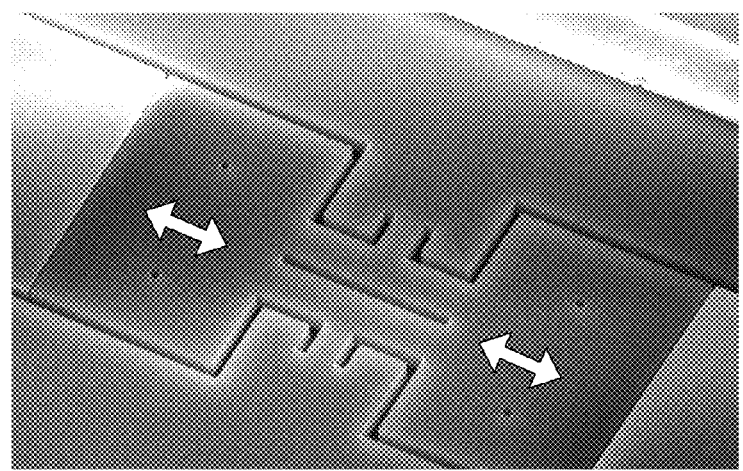
FIG. 3 shows an image of such a dog bone resonator.

In a first embodiment, the MEMS resonator is for example dog-bone shaped, similar to the resonator described in FIG. 3. However a difference is that in this embodiment, the device does not need to have electrostatic electrodes. As a result, there is no need to make small gaps between the dog-bone heads and the electrodes, which significantly relaxes the fabrication process.

Figure 5:
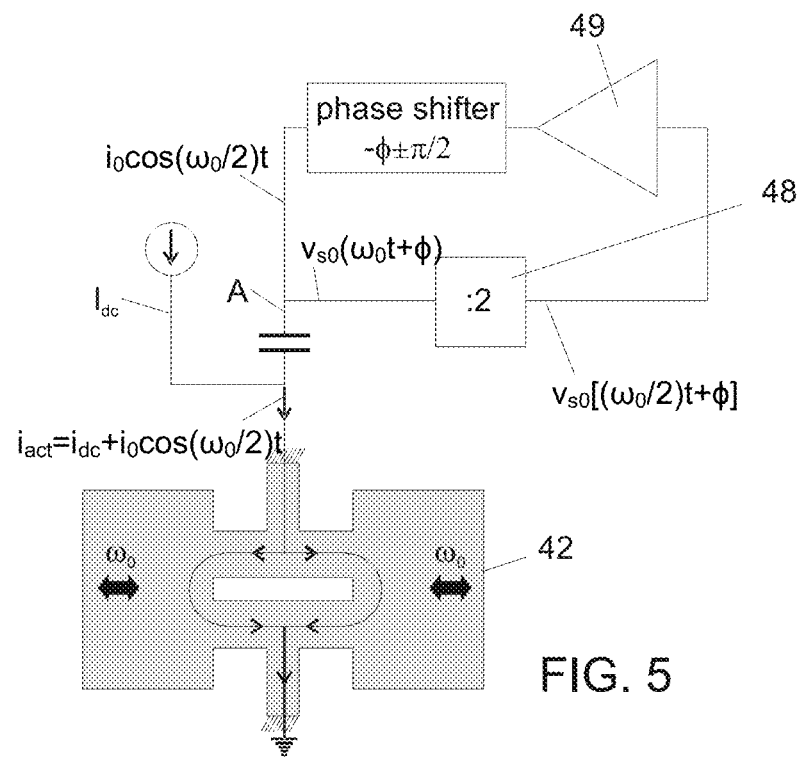
FIG. 5 shows a first example of implementation of the approach of FIG. 4.

The topology of the oscillator according to this embodiment is shown in FIG. 5. The four beams and the two masses of the dog-bone form the mass-spring system which has a resonant frequency of $\omega_0$. In this case, the piezoresistive element coincides with the beams (which are in fact the springs of the mass-spring system). When the beams contract and expand, resistance of the beams is modulated thanks to the piezoresistance effect.

When the device operating in the stable oscillation, at the signal terminal of the dog-bone resonator flows an actuation current, which comprises a DC and an AC current:

$$I_{act} = I_{dc} + I_{ac} = I_{dc} + I_0 \cos(\omega_0/2)t \quad (1)$$

As will be clear later, both DC and AC components have their purposes: The AC component is to generate actuation force, and the DC component is to read out the vibration signal.

The AC component has a frequency of $\omega_0/2$ which is exactly half of the mechanical resonant frequency. Here $\omega_0/2$ is in fact equivalent to $\omega_1$ as described in the general principle. The mixing of the DC and AC current is done using a capacitor which blocks the DC component from going into the circuit outside the resonator.

Joule's heating power generated by this current at the beams of the resonator (having resistance R) is:

$$P = RI_{act}^2 = \left(RI_{dc}^2 + \frac{1}{2}RI_0^2\right) + 2RI_{dc}I_0\cos\frac{\omega_0}{2}t + \frac{1}{2}RI_0^2\cos\omega_0 t \quad (2)$$

The heating power has three components: a DC component which does not contribute to the dynamic movement of the resonator, a $\omega_0/2$-component, and a $\omega_0$-component.

The $\omega_0$-component induces an AC thermal force of frequency $\omega_0$ thanks to the thermal expansion effect. The power function associated with the temperature change drives the resonator, so that the mechanical actuation is at double the excitation frequency.

Due to the thermal inertia, the AC force has some phase delay $\phi$ with respect to the power dissipation phase.

To estimate the phase delay, we use an analogy between thermal and electrical phenomena.

Figure 6:
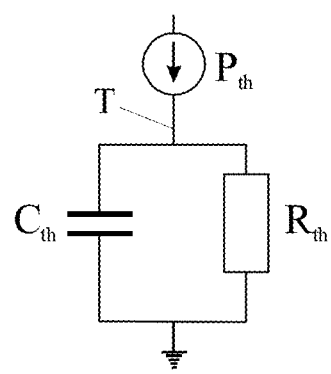
FIG. 6 shows a thermal circuit of the dog-bone resonator.

FIG. 6 shows the thermal circuit of the dog-bone resonator. Heat power dissipated in the beams of the dog-bone resonator can be considered equivalent to a current source that injects a current through a thermal capacitor and a thermal resistor connected in parallel. The current source in the electrical circuit is equivalent to the heat power ($P_{th}$), and temperature T at the beam is equivalent to voltage at the node between the R-C circuit and the current source.

The temperature at the beam, equivalent to the voltage at this node, can be expressed as:

$$T = \frac{P_{DC} + P_0 e^{j\omega_0 t}}{\frac{1}{R_{th}} + j\omega_0 C_{th}} \quad (3)$$

in which the numerator presents the Joule's heating power $P_{th}$ (equivalent to a combination of a DC and an AC current) and the denominator presents the complex heat conduction (equivalent to admittance).

It is not trivial to obtain an explicit analytical simplified expression for T in (3). Since in this calculation we are interested in the phase lag of the temperature with respect to the phase of the heating power at the steady state, (3) can be simplified by only considering the AC component of the heating power:

$$T = \frac{P_0 e^{j\omega_0 t}}{\frac{1}{R_{th}} + j\omega_0 C_{th}} = \frac{P_0}{\sqrt{R_{th}^{-2} + \omega_0^2 C_{th}^2}} e^{j(\omega_0 t - \omega_0 R_{th} C_{th})} \quad (4)$$

The temperature at the beams of the dog-bone resonator in the steady state is a sinusoidal function of time, with a delay $\phi = \omega_0 R_{th} C_{th} = -\omega_0 \tau_{th}$ with respect to the heat power generated by the AC current. Here, $\tau_{th}$ is the thermal time constant of the MEMS resonator.

As explained above, the $\omega_0$-component induces an AC thermal force of frequency $\omega_0$ thanks to the thermal expansion effect. The force can be expressed in terms of the temperature change at the beams. Since the force is proportional to the temperature change, it has also the same AC component as temperature change. Consider here only the amplitude $F_0$ of the force:

$$F_0 = E\alpha A T_0 \quad (5)$$

in which E is Young's modulus of the material of the resonator (e.g. of Si), $\alpha$ is the thermal expansion coefficient of the material, A is the cross-section of two beams (let's consider half of the dog-bone having a head and 2 beams for simplicity since the structure is symmetric), and $T_0$ is the amplitude of the temperature fluctuation at the beams, which is the amplitude of T in (4).

This force drives the resonator into mechanical resonance at $\omega_0$. The displacement x of the resonator can be written as:

$$x = -jF_0 Q/k_{eff} \quad (6)$$

where Q is the quality factor, and $k_{eff}$ is the effective spring stiffness of the resonator. The imaginary factor $-j$ in (6) implies that the displacement lags the force by a phase angle of 90 degrees. This also suggests that in the most efficient actuation, the force should lead the displacement by 90 degrees.

The amplitude of strain modulation of the beams is therefore:

$$\varepsilon = \frac{x}{l} = -j\frac{E\alpha A T_0 Q}{l k_{eff}} \qquad (7)$$

in which l is the length of one beam.

The strain modulation produces resistance modulation $\Delta R/R$ in the beams thanks to the piezoresistive effect. The resistance modulation has also the same frequency $\omega_0$ as the mechanical vibration. The amplitude of the modulation $R_0$ is:

$$R_0 = -j\frac{KE\alpha A T_0 Q}{l k_{eff}} \qquad (8)$$

in which, K is the piezoresistive gauge factor.

As mentioned above, at the signal terminal of the device flows a combination of an AC and a DC component of current. The AC component is used for actuation and the DC component is used for reading out the vibration. When the resistance of the device is modulated in the sinusoidal wave-form, via the DC readout component of the current, at the signal terminal (point A in the schematic) there is a sinusoidal signal voltage $v_s$ of frequency $\omega_0$:

$$v_s = v_{s0}\cos(\omega_0 t + \phi) \qquad (9)$$

with $v_{s0} = I_{DC} R_0$

The frequency $\omega_0$ of the output signal is equivalent to component $\omega_2$ as described in the general principle. Frequency $\omega_0$ of the signal is subsequently divided by 2 in a divider circuit (denoted as: 2 in the schematic of FIG. 5). Suppose the divider has unity gain, the signal coming out from the divider is:

$$v_{s1/2} = v_{s0}\cos\left(\frac{\omega_0}{2}t + \phi\right) \qquad (11)$$

The total transimpedance "loss" of the resonator and the divider can be defined by:

$$Z_m = v_{s1/2}/I_{ac} \qquad (10)$$

The signal of frequency $\omega_0/2$ is subsequently amplified in a transconductance amplifier which has a transconductance gain of $g_m$.

$$I_0 = \sigma_{s1/2} g_m \qquad (11)$$

The amplifier is preferably tuned so that it selectively amplifies only $\omega_0/2$.

The phase of $I_0$ is still the same as in (10). Next, this output current is phase-shifted by the amount of $-\phi\pm\pi/2$. Finally, this AC current $I_0$ is fed back to the signal terminal of the resonator, which is in fact the AC component of the actuation signal as described in the beginning.

If the amplifier gain is enough to ensure the total loop gain of at least 1 or in other words $|Z_m|*|g_m| \geq 1$, and the phase shifter is tuned so that the phase of the AC actuation force is $\pm-\pi/2$ with respect to the output signal phase, then a stable oscillation can be maintained within the loop.

Other components different than $\omega_0$ appearing at the input of the divider will not favourably selected by the resonator (and the amplifier) and will die out.

Figure 7:
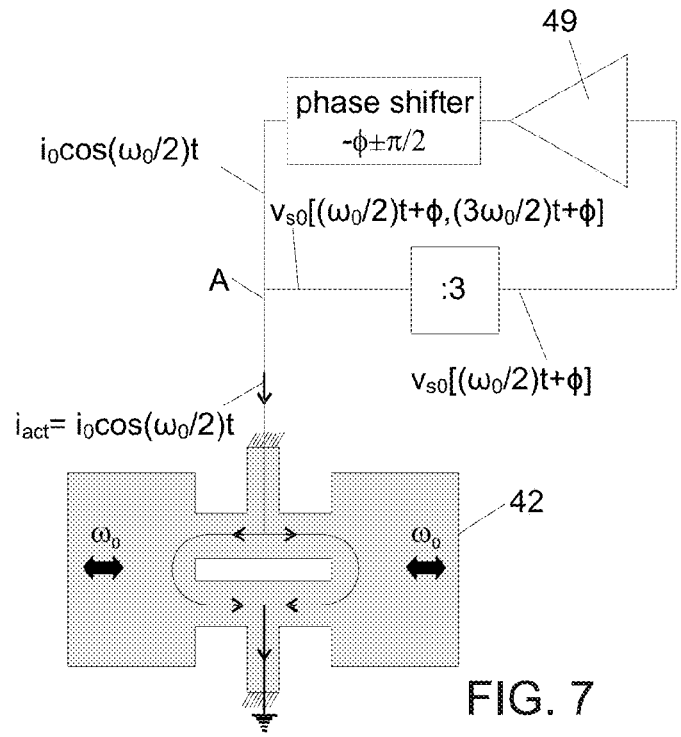
FIG. 7 shows a second example of implementation of the approach of FIG. 4.

In a second embodiment shown in FIG. 7, instead of using a combination of a DC and an AC current to actuate the resonator, only an AC component is used. In this case, the actuation current is:

$$I_{act} = I_0 \cos(\omega_0/2)t \qquad (12)$$

The heating power is:

$$P = RI_{act}^2 = \frac{1}{2}RI_0^2 + \frac{1}{2}RI_0^2 \cos\omega_0 t \qquad (13)$$

It can be seen that besides the DC component, the heating power has only one AC component of $\omega_0$, which will drive the resonator into mechanical resonance.

To readout the piezoresistive signal, the same AC current can be used. The voltage signal obtained at the signal terminal due to piezoresistance is:

$$v_s = R_0\cos(\omega_0 t + \phi)I_0\cos\frac{\omega_0}{2}t = \frac{1}{2}RI_0\left[\cos\left(\frac{\omega_0}{2}t + \phi\right) + \cos\left(\frac{3\omega_0}{2}t + \phi\right)\right] \qquad (14)$$

The output signal has two AC components: $\omega_0/2$ and $3\omega_0/2$. Both have the same amplitude. The $\omega_0/2$-component cannot be used since it has the same frequency as the feedthrough component. Instead we can use the $3\omega_0/2$-component. This component is divided by 3 in a divider, to become $\omega_0/2$, and then amplified, phase-shifted and finally fed back to the resonator in the same way as in the first embodiment.

The general principle of thermal oscillator according to the second approach is to provide two electrically separated conductive paths in the resonator. One of the paths is used for actuation and the other for sensing the device. This ensures that the crosstalk, or feedthrough signal is small.

The part of the resonator that contains the actuation path is mechanically coupled to the part of the resonator that contains the sensing path, ensuring that the sensing signal represents the mechanical motion that is actuated by the actuation signal. Various different embodiments are presented. Some of these are related to the ring-shaped resonator from US 2011204999, and other embodiments are related to the dogbone resonator that is described above. Some embodiments also combine the advantages of the ring-shaped resonators and the advantages of the dogbone.

Figure 8:
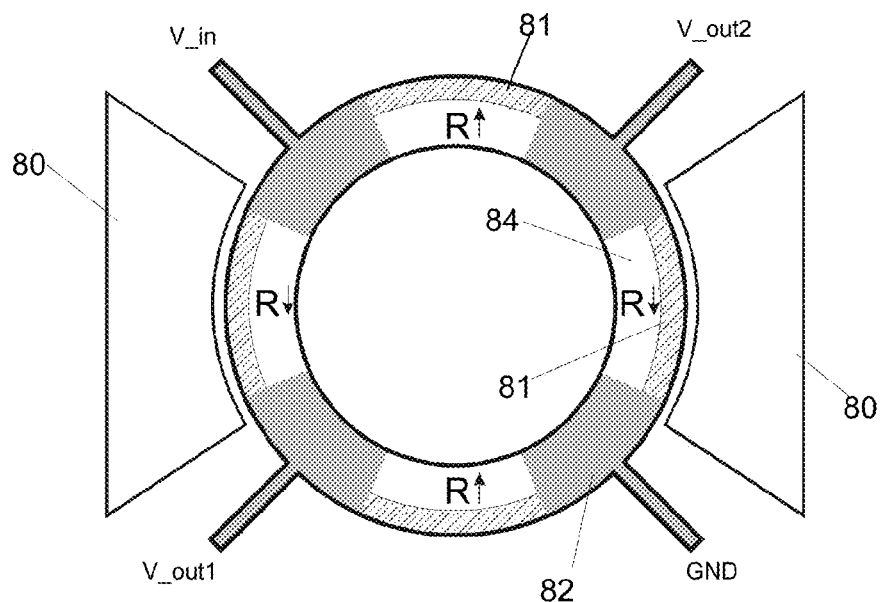
FIG. 8 shows a first example of a ring resonator.

FIG. 8 shows a ring resonator design taken from US2011204999. The resonator has a shape of a ring (although a symmetrical polygon frame, such as a square frame can also be used). The structure has an in-plane mode shape in which segments of the structure alternatively bend inward and outward, while the width of the structure substantially remains unchanged. Anchors are positioned at the four quasi-nodal points of the mode shape, i.e. at the boundaries between the segments.

There are two electrodes 80 placed close to the outer rim, at two opposite segments. If a combination of AC and DC excitation voltages is applied on the electrodes, the ring will vibrate in the elliptic mode shape in which the segments of the ring between the anchors alternatively flex inward and outward. The anchors are positioned at the nodes of the mode shape at which the structure only slightly rotates, but not significantly displaces. With this arrangement the vibration energy loss through the anchors is minimized.

At every segment of the ring, the outer rim and the inner rim have opposite strain signs and the strain sign alternates from one segment to the next. For instance, the outer rim of the upper segment contracts while the inner rim of the same segment extends. At the same time, outer rim of the right segment (i.e. the neighbor segment) extends while its inner rim contracts, and so on.

To collect the piezoresistive signals due to strain induced in the structure, four regions 81 are locally doped with a suitable doping concentration (normally it is a relatively low concentration). The piezoresistive regions are located at every segment of the ring. They can be arranged alternatively at the inner and outer rim, where the magnitudes of strain are maximum, although this is not shown in FIG. 8. In that way, the arrangement of the piezoresistive regions is such that during vibration, they undergo strain with the same sign. The areas 82 in between the piezoresistive regions are doped with high concentration to make the material low ohmic. These low ohmic regions also extend to the anchors and from the anchors to the outside world. The low ohmic regions serve as the electrical connections between the piezoresistive regions and from these regions to the outside world. These low ohmic regions therefore have no significant contribution to the piezoresistive signal.

The rest of the ring area 84 is left undoped, thus having very high resistance.

This implementation of the invention avoids the need for the electrostatic electrodes 80, and uses for example two quarters of the ring for thermal actuation and the other two quarters for piezoresistive detection. Alternatively one quarter of the ring can be used for thermal actuation and the opposite quarter for piezoresistive detection.

Figure 1:
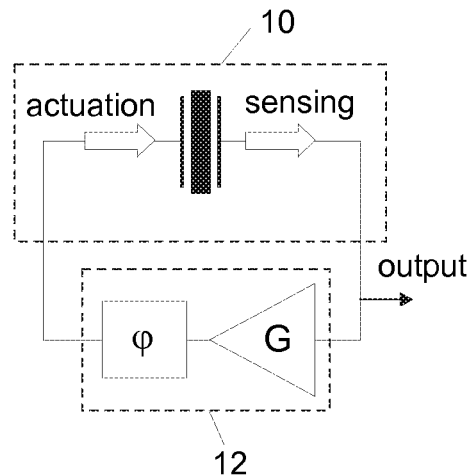
FIG. 1 shows schematically a conventional MEMS-based oscillator
Figure 2:
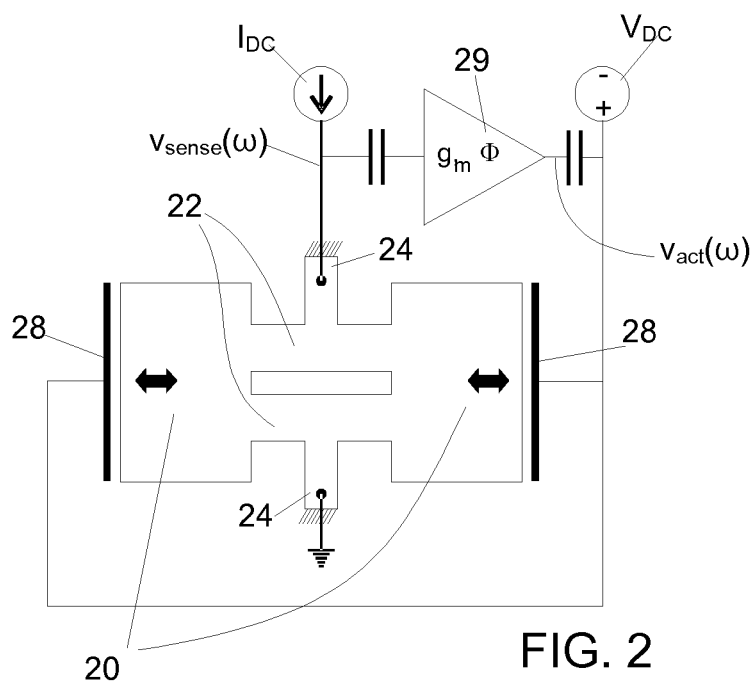
FIG. 2 shows an example using a dog bone resonator.

This implementation of the invention can instead be based on the dogbone shown in FIG. 2. By modifying the doping profile in the device, the left side of the device can be used for thermal actuation while the right side can be used for piezoresistive detection (or vice-versa). In some particular embodiments of both type of designs, a plurality of resonators is mechanically coupled to gain more flexibility in connectivity and higher signal to noise ratio.

The basic concept of thermally actuated, piezoresistively sensed MEMS resonators using separate conductive paths is known. The article by C-C Chen et al. "Thermally actuated and Piezoresistively sensed CMOS MEMS resonator array using differential mode operation" IFCS 2012, proceedings in press describes two mechanically coupled dogbone resonators. One is used for actuation and the other for detection. The main disadvantage of that approach is that they still need to sense a resistor, which is done with a current source. This is less favourable in low-voltage IC design because it needs voltage headroom.

Figure 9:
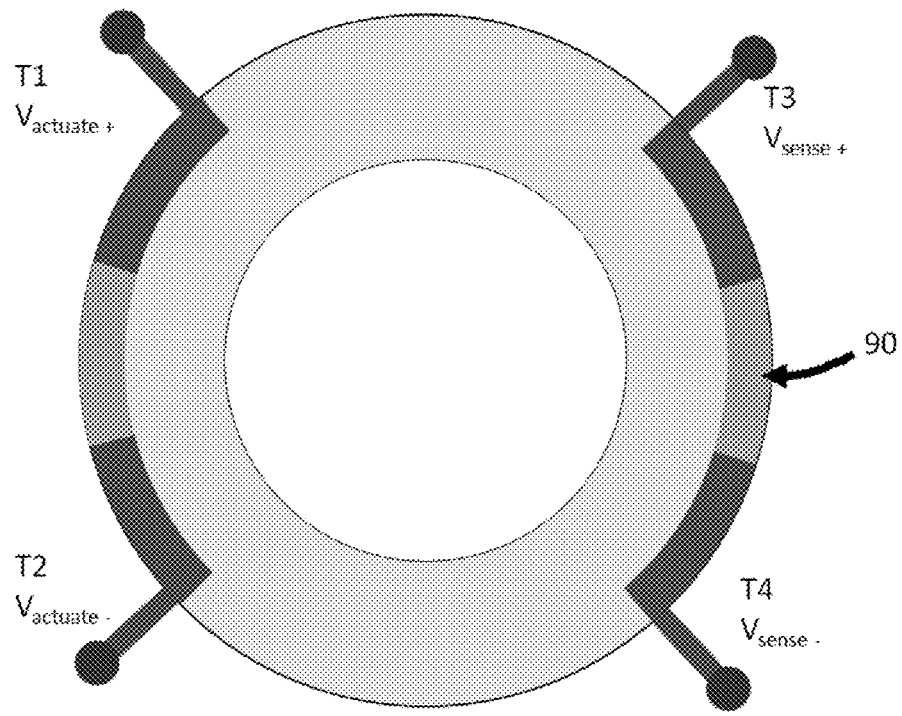
FIGS. 9 to 13 show implementations of the second approach of the invention applied to a single ring resonator.

A first embodiment based on this second approach is shown in FIG. 9.

This version uses a ring-shaped resonator, similar to US 2011204999. It is suspended from four anchors that also form the electrical terminals (labelled T1 to T4. The difference as compared to US 2011204999 is that there are no electrostatic actuation terminals. The actuation signal is connected to terminals T1 and T2 and the mechanical motion is sensed at terminals T3 and T4.

There are two lightly doped regions 90 between terminals T1 and T2 and between terminals T3 and T4. The regions which connect to the anchors are highly doped and the remainder of the structure is undoped.

The operating principle is as follows. A sinusoidal voltage or current (in this example it is a voltage: $V_{acurate}(t)$) is supplied between terminals T1 and T2.

$$V_{actuate}(t) = V_{DC} + V_{act} \sin \omega t$$

Where $V_{act}$ is the amplitude and $V_{DC}$ is the DC component of the actuation voltage. The excitation current is forced to flow through only one side of the ring width, e.g. the outer rim of the ring. This actuation signal will periodically heat the quarter asymmetrically, leading to periodic bending of the quarter, and consequently inducing the elliptic vibration of the whole ring. In between the heating periods, the resistor is cooled down due to heat loss through the anchors and radiation, thus the resistor undergoes a heating wave. The heating wave will have two frequency components: $\omega$ and $2\omega$. $\omega$ should match the resonance frequency of the elliptical mode shape and thus will drive the ring into the resonance of this frequency.

Figure 10:
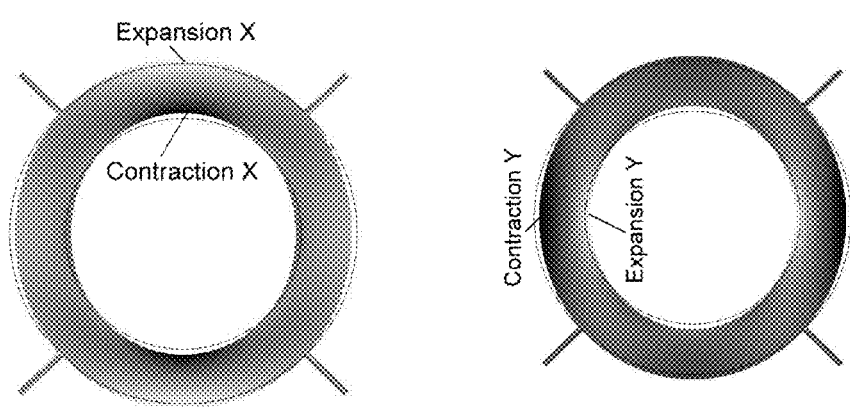

FIG. 10 shows a finite element simulation showing the flexural ellipse mode shape of the ring-shaped resonator. The gray-scale coding indicates strain in the X (left picture) and Y (right picture) directions. During vibration, the inner and outer rims of consecutive segments contract and expand alternately.

Every node of the mode shape has an anchor in this example. This is not necessarily the case. The number of nodes could be larger than the number of anchor points, for example when driving the resonator at an overtone. This also holds for all other resonators described in this application.

The frequency component at $2\omega$ can be ignored because it does not actuate a corresponding mode.

Due to the vibration of the ring, its periphery is periodically strained. The resistance path between output terminals T3 and T4 is therefore periodically modulated thanks to the piezoresistive effect.

Figure 11:
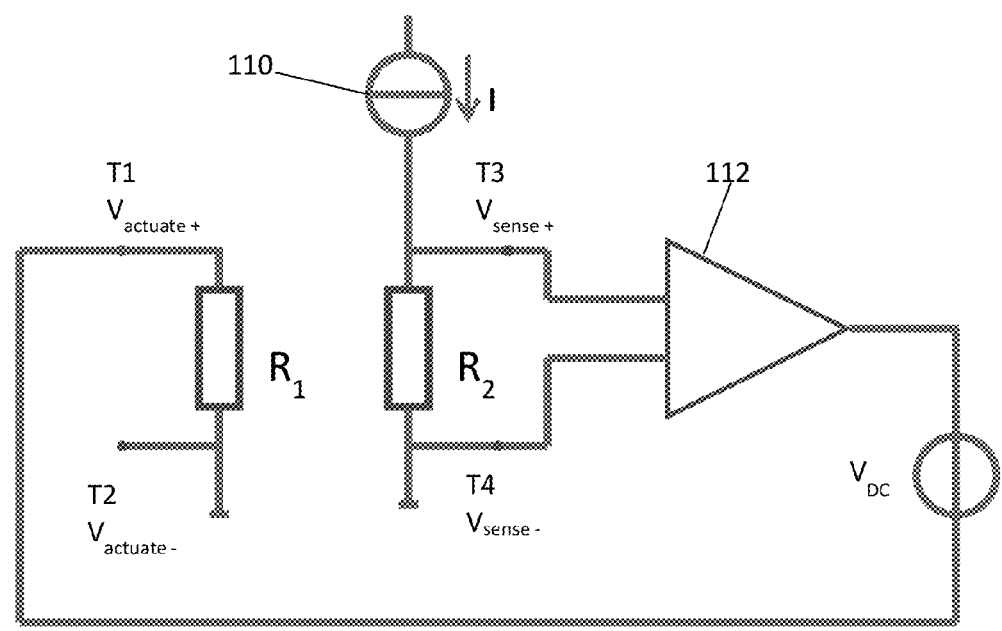

FIG. 11 shows how this resonator can be made into an oscillator.

The resistance modulation at the output terminals T3 and T4 is converted into a voltage with by means of a current source 110. This voltage is amplified by amplifier 112, its phase is corrected (by the amplifier or a separate phase shifter) and it is sent back to the actuation terminal. When the oscillation conditions are met (total loop gain equals or larger than unity and total loop phase is zero), an oscillation signal of frequency is maintained within the loop.

Thanks to the separated paths, the feedthrough between input and output can be largely reduced. However, there might be some inevitable and small parasitic feedthrough that remains and needs to be minimized. Three types of unwanted electrical feedthrough coupling between the input and output can be identified. First, there is capacitive and inductive coupling between terminal T1 and T3 and their connections to the amplifier (which resides in an ASIC die). The second type of feedthrough coupling may occur at the ground terminal(s) (T2 and T4). There are two possibilities. Either both terminals share the same bondpad, or each terminal has its own bondpad. In the former case, feedthrough coupling may occur because of resistive or inductive voltage drop across the bondwire. In the latter case the feedthrough coupling may occur because of capacitive coupling between the two bondpads and bondwires. The third type of coupling between actuation and sensing is resistive in nature.

The layout in FIG. 9 will have some resistive feedthrough through the undoped parts in the ring, since undoped Si has a finite resistivity (in fact, undoped Si cannot be manufactured in practice so there will always be some background doping). This resistive path has a value of typically several orders of magnitude larger than the resistance from e.g. T1 and T2.

Figure 12:
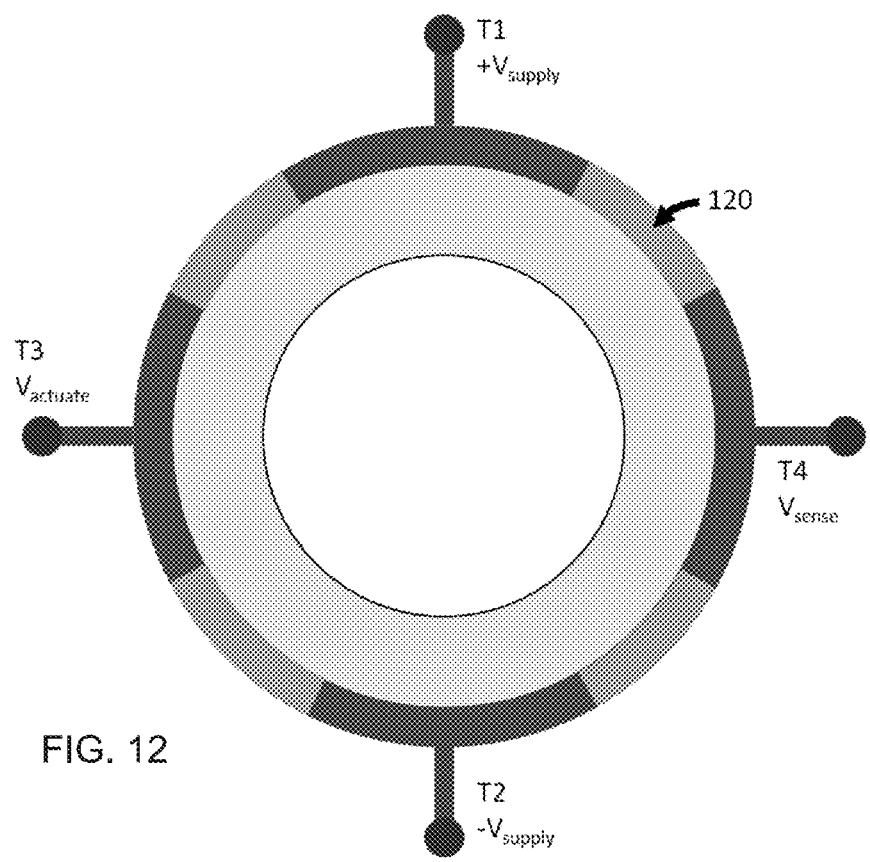

A second embodiment is illustrated in FIG. 12. The ring resonator only differs from the first embodiment by the location of the doped regions. In this case there is a piezoresistor 120 (formed as a lightly doped region) on the rim in each quadrant of the ring. Again, a highly doped region connects to the anchors.

Figure 13:
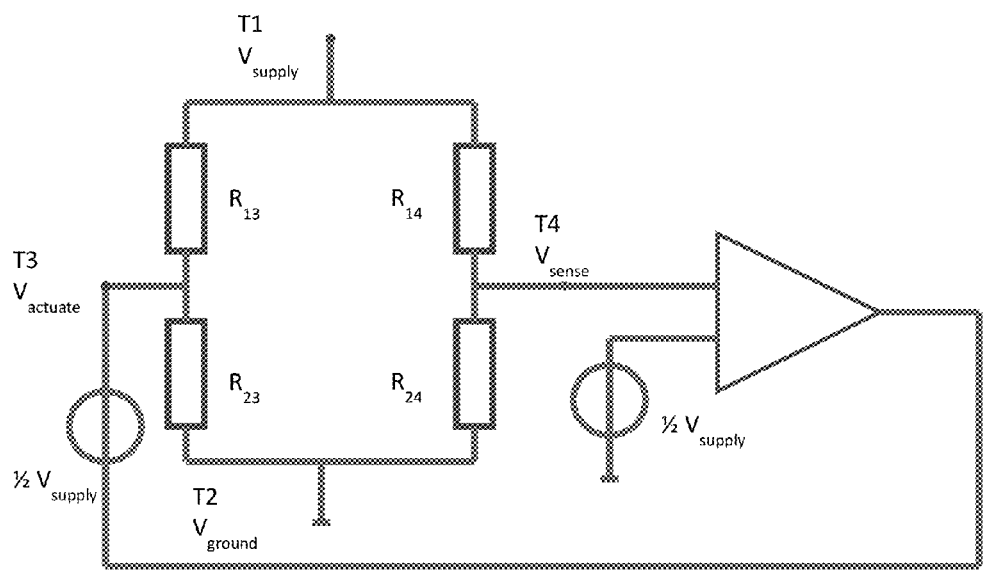

A simplified equivalent circuit of an oscillator made with this resonator is shown FIG. 13. Piezoresistors $R_{13}$ and $R_{23}$ are connected to the actuation terminal. The actuation signal is a sinusoidal wave with frequency $\omega_{res}$.

$$V_{actuate}(t) = V_{act} \cdot (1 + \sin \omega_{res} t)$$

$V_{act}$ is the amplitude of the actuation signal and $\omega_{res}$ is the mechanical resonance frequency of the elliptical mode of the resonator.

The power dissipation of $R_{13}$ and $R_{23}$, and hence their temperature is 180 degrees out of phase:

$$P_{R13} \propto \frac{\frac{1}{4} V_{supply}^2 - V_{supply} \cdot V_{act} \cdot \sin \omega_{res} t}{R_{13}}$$

$$P_{R23} \propto \frac{\frac{1}{4} V_{supply}^2 + V_{supply} \cdot V_{act} \cdot \sin \omega_{res} t}{R_{23}}$$

In the above equations the term at $2\omega_{res}$ is ignored. Because of the 180 degrees phase difference between the temperature of $R_{13}$ and $R_{23}$ the ring will resonate in the elliptical mode.

The deformation of the ring is sensed by the two piezoresistors $R_{14}$ and $R_{24}$. The resistance change of the two resistors is 180 degrees out of phase because when the quadrant of $R_{14}$ is pointing outward the quadrant of $R_{24}$ is pointing inward (or vice versa). Therefore:

$$R_{14} = R_{DC} + \Delta R \cdot \sin \omega_{res} t$$

$$R_{24} = R_{DC} - \Delta R \cdot \sin \omega_{res} t$$

$$V_{sense} = \frac{R_{14}}{R_{14} + R_{24}} V_{Supply} - \frac{R_{24}}{R_{14} + R_{24}} V_{Supply}$$

$$V_{sense} = \frac{\Delta R}{R_{DC}} \cdot (\sin \omega_{res} t) \cdot V_{Supply}$$

Where $\Delta R$ is the modulation at resonance of one piezoresistor and $R_{DC}$ is the value of that resistor at rest. This output voltage can be amplified and after phase adjustment it can be fed back to the resonator to sustain the oscillation. The advantage of this embodiment in comparison to the previous one is that no current source is needed to read out the sensing resistor. Current sources are unfavourable for low voltage applications because they cost voltage headroom. Moreover, practical current sources contribute significantly to the noise in the oscillator.

The embodiment of FIGS. 12 and 13 has the disadvantage that noise on e.g. the power supply is directly coupled into the resonator and from the resonator to the amplifier. This can be solved by making a fully balanced resonator design. That means that the actuation is now done by the difference between signals that are 180 degrees shifted in phase with respect to each other. Interference from outside that affects these two signals to the same extent cancels out in their difference.

Similarly the output signal is composed of the difference between two output signals that are identical except for the 180 degree phase difference.

Figure 14:
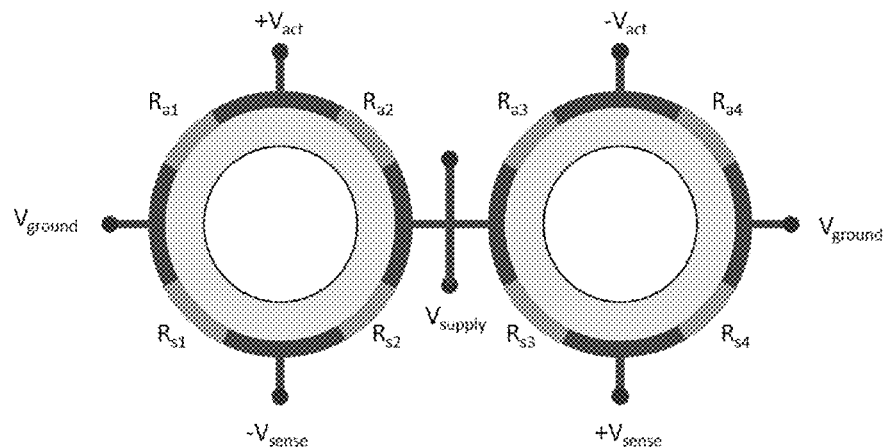
FIGS. 14 to 16 show implementations of the second approach of the invention applied to a pair of connected ring resonators.
Figure 15:
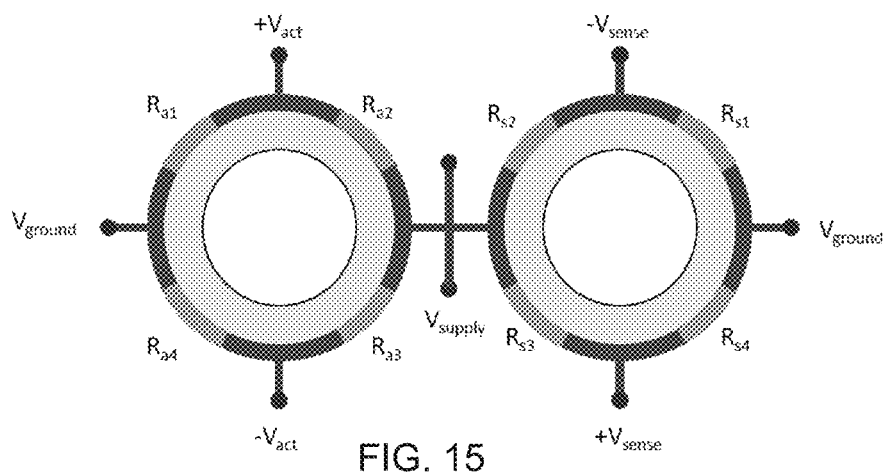

FIGS. 14 and 15 show such a design.

Each design consists of two ring resonators connected to each other at the $V_{supply}$ terminal. Most preferably the two resonators are not only electrically coupled but also mechanically coupled. The mechanical coupling should be such that the two resonators resonate out of phase. The coupling can be done via a coupling beam in between the rings.

This device has two actuation terminals labelled $+V_{act}$ and $-V_{act}$. It also has two sensing terminals labelled $+V_{sense}$ and $-V_{sense}$. Finally there are two $V_{ground}$ terminals and a $V_{supply}$ terminal.

The version of FIG. 14 has one actuation terminal and one sense terminal on each ring, whereas the version of FIG. 15 has both actuation terminals on one ring and both sense terminals on the other ring. By providing all actuation terminals on one ring and all detection terminals on the other, this reduces the unwanted feedthrough signal from actuation to detection and avoids asymmetry in $V_{sense}$ due to mismatch of mechanical properties of both resonators.

Figure 16:
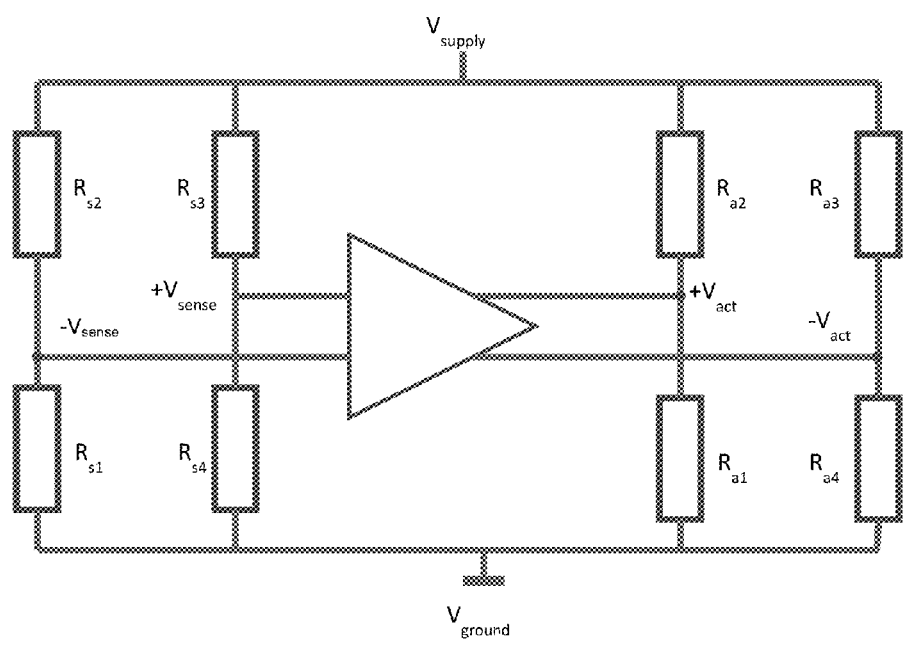

The simplified circuit diagram of the fully balanced dual ring resonator of FIG. 15 is shown in FIG. 16. Four piezoresistors are used to sense the mechanical resonance and four others are used to thermally actuate the device.

A potential drawback of the two ring resonators described above may be that for a manufacturable size they operate in relatively low resonance frequency (typically below 30 MHz) due to the bending mode shape. It is known that to reduce phase noise, it is desirable to have high frequency such as >50 MHz. To scale up frequency, the width of the ring needs to be thicker and/or the outer diameter of the ring needs to be smaller. Either of the options leads to too small dimensions to manufacture reliably. Alternatively a disk-shaped resonator can be used. The disk-shaped resonator is actually a special case of the ring-shaped resonator in which the width of the ring becomes equal to its outer radius. The disk-shaped resonators can operate at substantially higher frequencies compared to the ring resonators, because the resonance mode is bulk mode.

Figure 17:
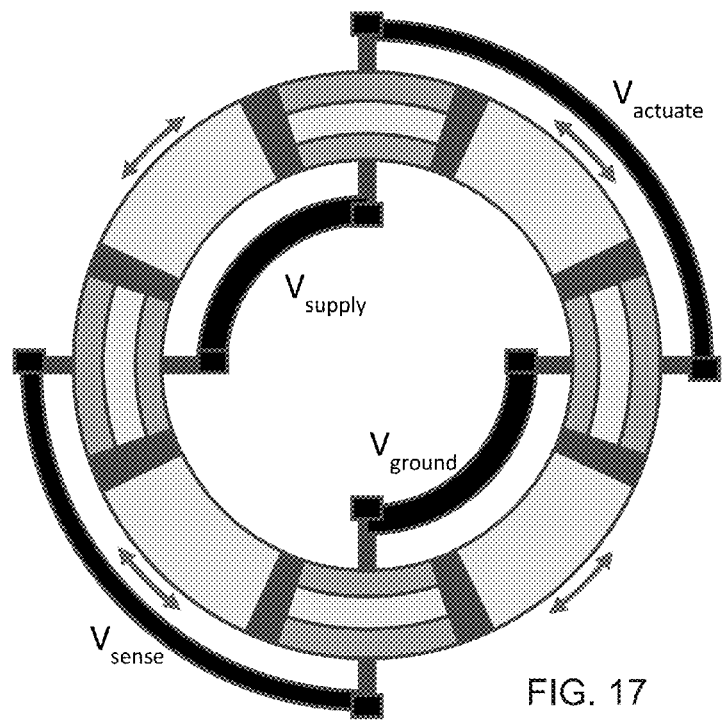
FIGS. 17 and 18 shows a second example of ring resonator.

In another example, the ring resonator in FIG. 17 operates in bulk mode, giving substantially higher resonance frequencies for a given size. The device consists of a freestanding ring with 4 identical segments that can resonate tangentially. Each two adjacent segments move in anti-phase with respect to each other. Anchors can be placed at the nodes of the vibration mode, where the material is substantially standing still.

Each piezoresistor comprises a radially inner part and a radially outer part, separated by an undoped region.

Figure 18:
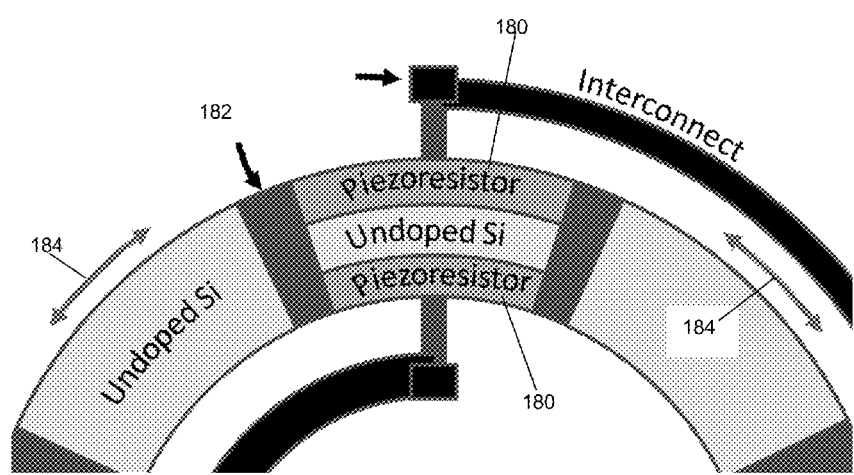

FIG. 18 shows one of the piezoresistor sections in more detail. Each segment has two piezoresistors 180, one on the inner and one on the outer rim of the ring. At their two ends these resistors are electrically connected together by highly doped silicon interconnects 182 and at their centre they are each connected to their own anchor, again by highly doped sections. The undoped area between the piezoresistors serves as electrical isolation; no substantial current may run through this area.

All anchors inside the ring are connected to either the power supply or to ground. The anchors outside the ring are connected in adjacent pairs to the actuation terminal or to the sensing terminal.

When a current is sent through the two resistors they expand as a result of Joule heating and when two adjacent sets of resistors are periodically heated in anti-phase then the large undoped section between the two sets of resistors will move back and forth as indicated by the arrows 184. The mode shape of the ring is the acoustic standing wave. The widths of the two resistors need to be designed such that expansion of the segment happens tangentially. The two resistors are electrically in parallel and from now on we treat the total resistance between one set of anchors as one single resistor.

An oscillator with this single ended bulk-mode resonator can use the circuit of FIG. 13 with the resistor labels in the circuit diagram of FIG. 13 each referring to this combined resistor.

It may be desired to having driving and sensing of the resonator in a fully balanced manner. The corresponding circuit diagram is that shown in FIG. 16.

Figure 19:
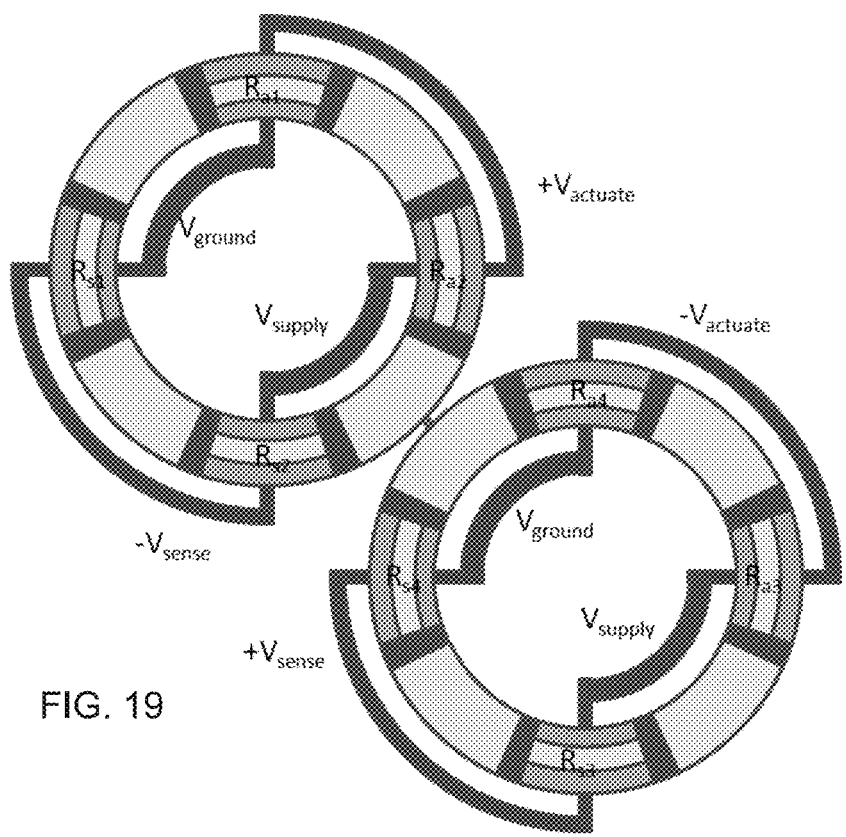
FIGS. 19 to 21 show implementations of the second approach of the invention applied to a pair of connected ring resonators of the type shown in FIGS. 17 and 18.

FIG. 19 shows a first example of fully balanced bulk-mode dual ring resonator. Essentially two of the resonators of FIG. 17 are combined at one of the anchors. Each ring has one sense and one actuation electrode.

Figure 20:
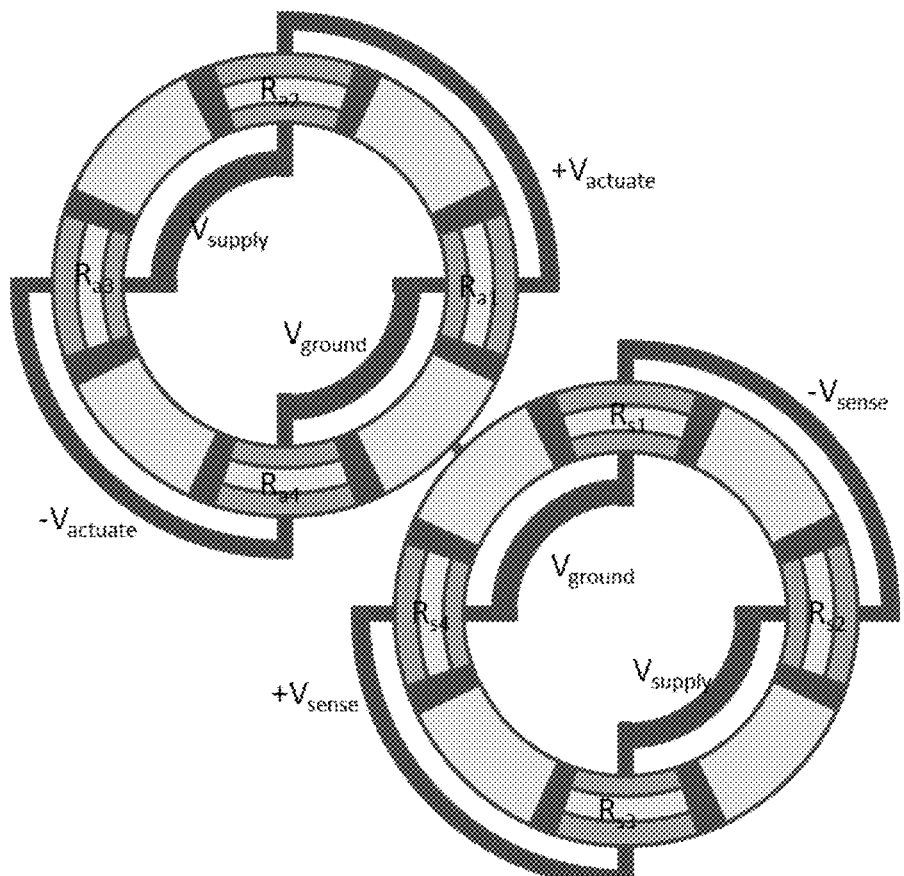

In the variation of FIG. 20, the driving and sensing are on separate rings.

Figure 21:
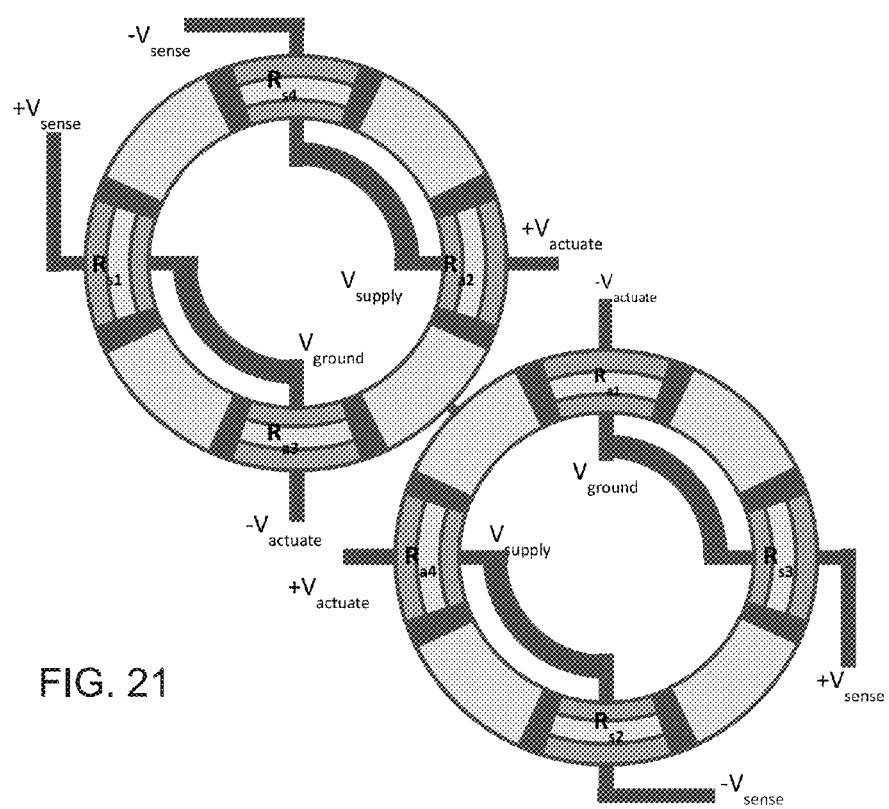

The fully balanced bulk-mode dual-ring resonator shown in each of FIGS. 19 to 21 consist of two resonators of the type shown in FIG. 17. They are mechanically coupled at one point on their rims. The first two variations of FIGS. 19 and 20 have the advantage that the two sensing electrodes are positioned on one side of the device while the actuation electrodes are on the other side. Power supply and ground are in between. This is beneficial to reduce the unwanted feedthrough between the actuation and the sensing.

The third variation of FIG. 21 has two actuation electrodes and two sensing electrodes on each ring. This gives the advantage that the actuation is done symmetrically around the point where the two rings are mechanically coupled, this may give a better matching of the temperature of the two coupled rings.

Figure 22:
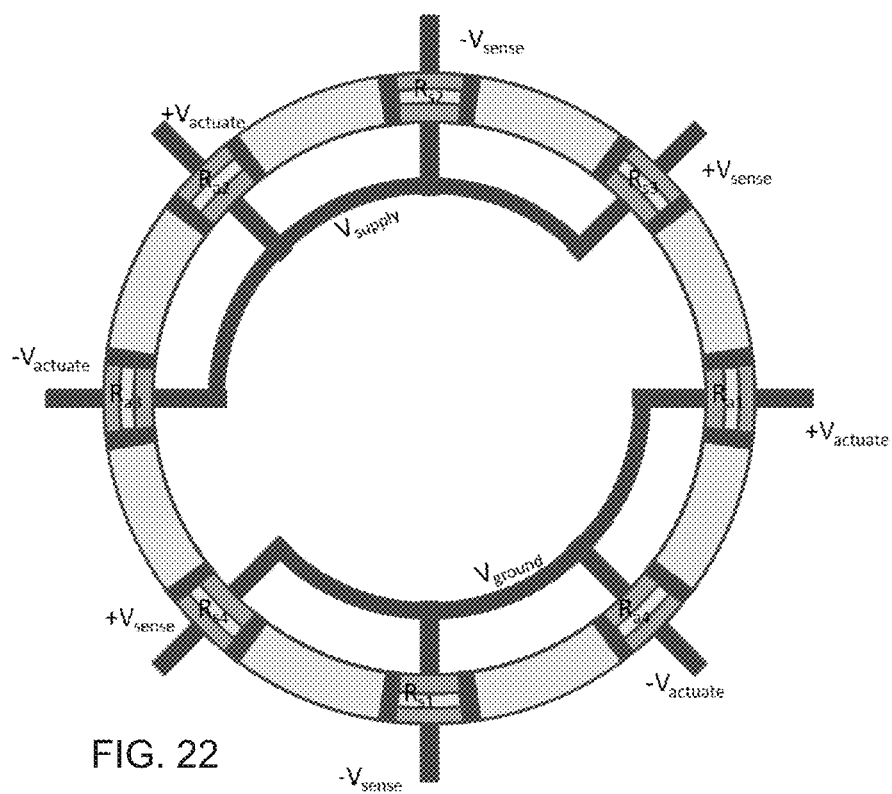
FIG. 22 shows a third example of ring resonator for implementing the second approach of the invention.

FIG. 22 show a design which provides a fully balanced bulk-mode ring resonator using only a single ring. The ring is divided into eight segments instead of four. Again each adjacent pair of two segments vibrates in anti-phase with respect to each other. There are several different ways of connecting the actuation signals, sensing signals and power supply and ground to this device. Note that these are just examples. The number of segments could be larger (as long as the total number is even) and not all segments need to be electrically connected, nor mechanically anchored. In particular, one or more 'spacer' segments between actuation and sensing segments will reduce the unwanted feedthrough.

In FIG. 22, the outer piezoelectric elements are connected in a sequence as the positive sense electorde, the negative sense electrode, the positive actuation electrode and the negative actuation electrode. For a first sequence of outer elements, the inner elements are connected to the supply voltage and for a second sequence of outer elements, the inner elements are connected to ground.

Figure 23:
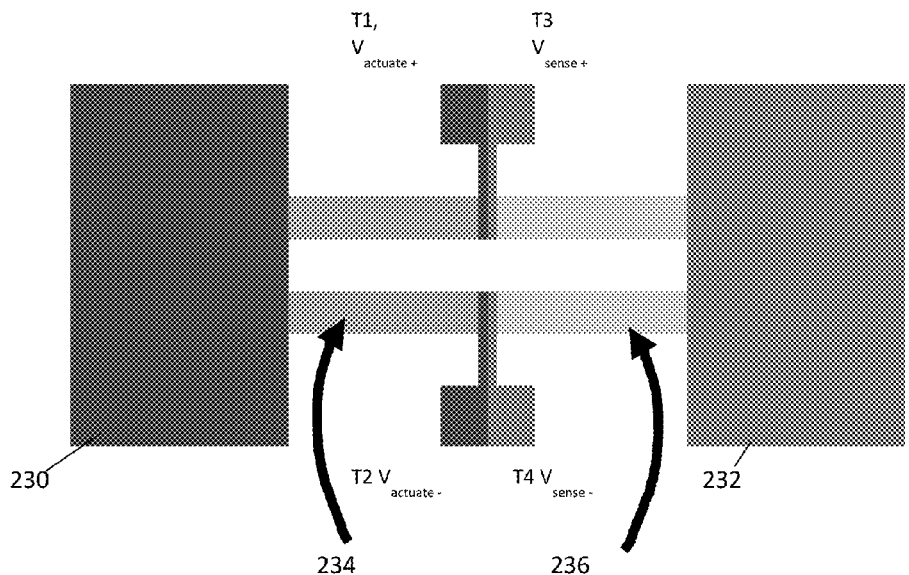
FIG. 23 shows the second approach of the invention applied to a dog bone resonator design.

FIG. 23 shows an embodiment which is based on the dogbone resonator.

The resonator has two heads, one 230 is highly p-doped and the other 232 is highly n-doped. The central terminals connect to the heads by piezoresistive beams. The two beams 234 that connect to the first head 230 are lightly p-doped and the two 236 that connect to the second head 232 are lightly n-doped.

In this case, the actuation path and the sensing path are separated by doping one side of the resonator P-type and the other side N-type. As long as the P-type side is biased at a lower voltage than the N-type side there is an effective separation between the actuation and the sensing signal. The junction capacitance at the anchors will be the main cause of feedthrough. The design can be considered to have four terminals as shown, although terminals T1 and T3 are connected and can be considered as one double terminal, and terminals T2 and T4 are also connected and can be considered as one double terminal.

Figure 24:
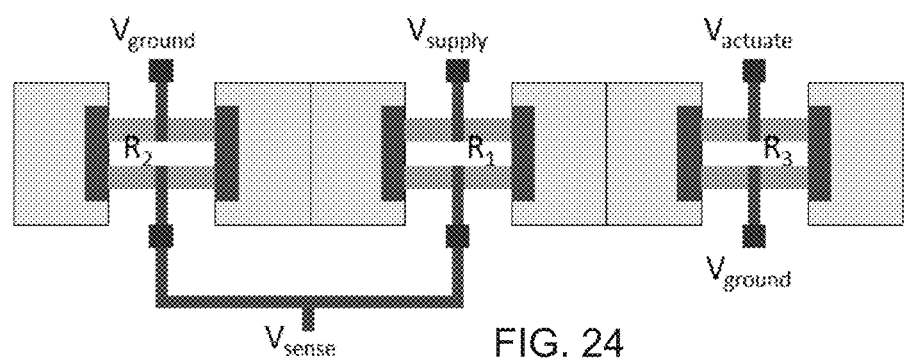
FIGS. 24 to 27 shows implementations of the invention using multiple connected resonators of the type shown in FIG. 23.

FIG. 24 shows how a row of three coupled dogbone resonators can be used to make one new, thermally actuated resonator. The coupling between adjacent resonators is at the heads, so that there is only one freestanding head at one end and a freestanding head at the other end. One end device connects to ground and the sense electrode, and the other end device connects to the actuation and ground terminals. The middle device connects to the sense electrode (shared with the first end device) and the supply.

Figure 25:
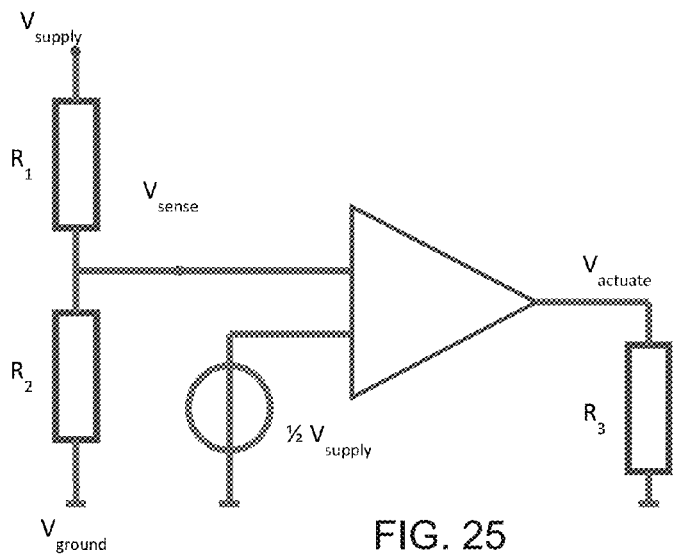

The sense electrode is thus connected to two piezoresistors and not one. As a result, no current source is needed to sense the signal. One resonator is connected to the actuation signal, one is connected to the supply signal, and two are connected to the sense terminal. The corresponding simplified circuit diagram for an oscillator is shown in FIG. 25.

The number of dogbones can be increased by inserting dogbones that have no electrical connection to them. By placing these electrically unconnected dogbones between the actuation and sensing dogbones the unwanted feedthrough between the actuation and sensing is reduced because the distance between them is increased.

Figure 26:
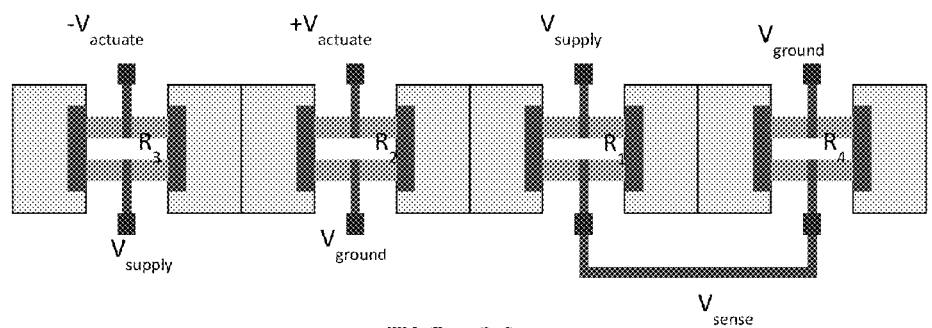
Figure 27:
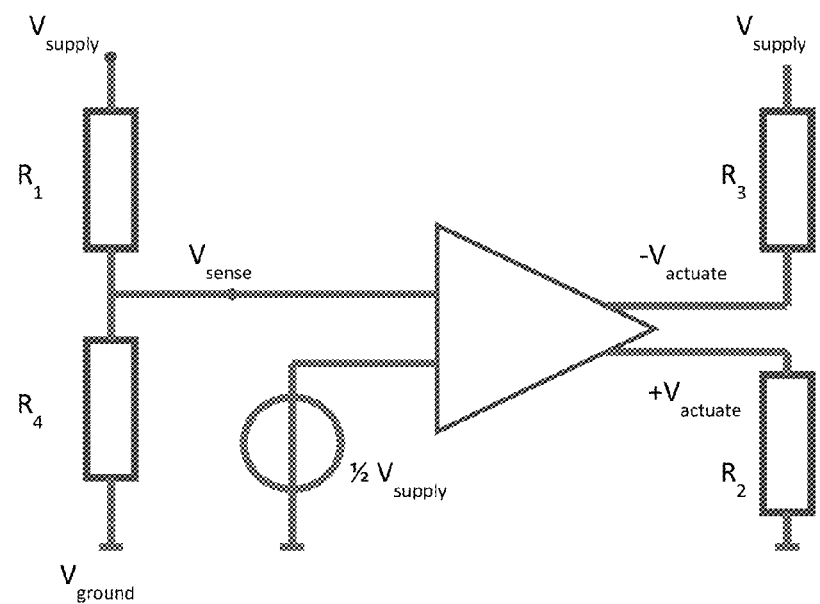

Several variations are possible, as illustrated by FIG. 26 with circuit diagram in FIG. 27. A fully balanced version is also possible.

in FIG. 26 there are four connected dogbone resonators. Again the sense electrode connects to two resonators. One resonator is connected to the positive actuation signal, one is connected to the negative actuation signal, two are connected to the supply voltage, and two are connected to the sense terminal.

The invention makes use of thermal actuation. In this way, there is no need to have actuation gaps and electrodes, which significantly relaxes the fabrication process, thus reduces cost.

By avoiding the use of electrostatic actuation, the size of the electrode area is not anymore relevant, giving the opportunity for free down-scaling of dimensions (thus up-scaling of frequency). The charging on the resonators, especially when silicon oxide skin is used for temperature compensation, no longer influences the actuation force and modify the frequency.

The two-frequency scheme outlined above means the feedthrough signal is not amplified by the amplifier and selected by the resonator, hence will die out in the loop. Only the useful signal component which relates to the vibration of the resonator will be maintained. The oscillation can be easier and more efficiently maintained.

The two-frequency scheme also reduces the number of bondpads of the MEMS resonator to only two. This makes the resonator die significantly cheaper because total area is dominated by the bondpads.

The scheme outlined above with separate actuation and detection paths limits the feed-through signal to a very low value, but not to zero. On the other hand the absence of frequency divider makes the electronic circuit much simpler to implement.

The invention provides solutions that can use balanced sensing compatible with low-voltage on-chip implementation of the ASIC.

MEMS oscillators are expected to replace quartz crystals in high-precision oscillators. The oscillators are widely used in time-keeping and frequency reference applications such as real time clocks, RF modules in mobile phones, devices containing blue-tooth modules, USB modules, and other digital and telecommunication devices, etc.

Various modifications will be apparent to those skilled in the art.

The invention claimed is:

1. An oscillator comprising:
   a MEMS resonator having a first terminal and a second terminal;
   an AC current source for providing an AC current to a resonator input coupled to the first terminal, thereby to induce an alternating strain in the resonator by means of the thermal expansion effect to drive the resonator into resonance; and
   a piezoresistive read out sensor, coupled to the first terminal, for monitoring a resistance of at least a portion of the resonator to derive an oscillating output signal at an output of an oscillator circuit; and
   wherein the oscillator circuit provides the ac current with a first frequency $\omega_1$ to actuate the resonator and wherein a second different frequency $\omega_2$ is generated in the resonator by the piezoresistive effect to derive the output signal, wherein the oscillator circuit comprises a converter in a feedback control loop between the oscillator output and the resonator input for converting from the second frequency to the first frequency; and
   wherein the first terminal of the resonator is configured to both receive the AC current at the first frequency $\omega_1$ and output the piezoresistive read out at the second frequency $\omega_2$.

2. The oscillator as claimed in claim 1, wherein the oscillator circuit further comprises a phase shift element.

3. The oscillator as claimed in claim 1, wherein the oscillator circuit further comprises a DC current source for providing a DC current to the resonator input.

4. The oscillator as claimed in claim 1, wherein the resonator comprises two masses connected by a pair of parallel beams, with the AC or AC+DC current provided to one beam and being drained from the other beam.

5. The oscillator as claimed in claim 1:
   wherein the second terminal is coupled to a ground.

6. The oscillator as claimed in claim 1:
   wherein the first and second terminals are anchor points of the resonator.

7. The oscillator as claimed in claim 1:
   wherein the resonator is a piezoresistive resonator.

8. An oscillator comprising:
   a MEMS resonator having a first terminal and a second terminal;
   wherein the first terminal is configured to both input an input signal having a first frequency $\omega_1$ and output an output signal a having a second frequency $\omega_2$;
   wherein the resonator is configured to resonate and generate the output signal at the second frequency $\omega_2$ in response to the input signal at the first frequency $\omega_1$; and
   an oscillator circuit having a feedback control loop coupled to the first terminal and configured to convert the second frequency $\omega_2$ to the first frequency $\omega_1$.

9. The oscillator as claimed in claim 8:
   wherein the input signal is an actuation current and the output signal is a piezoresistive voltage.

10. The oscillator as claimed in claim 9, wherein the feedback control loop includes:
    a frequency divider configured to convert the second frequency $\omega_2$ to the first frequency $\omega_1$; and
    a transconductance amplifier to convert the piezoresistive voltage to the actuation current.

* * * * *